United States Patent
Matsuda

(10) Patent No.: US 11,521,536 B2
(45) Date of Patent: Dec. 6, 2022

(54) DISPLAY APPARATUS AND ELECTRIC APPARATUS WITH CONTROLLED CURRENT LEAKAGE AMONG SUBPIXELS

(71) Applicant: CANON KABUSHIKI KAISHA, Tokyo (JP)

(72) Inventor: Yojiro Matsuda, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/420,357

(22) Filed: May 23, 2019

(65) Prior Publication Data

US 2019/0378450 A1    Dec. 12, 2019

(30) Foreign Application Priority Data

Jun. 12, 2018   (JP) .............................. JP2018-112217

(51) Int. Cl.
| | | |
|---|---|---|
| G09G 3/3208 | (2016.01) | |
| G09G 3/20 | (2006.01) | |
| G09G 3/3233 | (2016.01) | |
| H01L 27/32 | (2006.01) | |
| H01L 51/52 | (2006.01) | |

(52) U.S. Cl.
CPC ......... *G09G 3/2003* (2013.01); *G09G 3/3233* (2013.01); *H01L 27/3211* (2013.01); *H01L 51/5203* (2013.01)

(58) Field of Classification Search
None
See application file for complete search history.

(56) References Cited

U.S. PATENT DOCUMENTS

| | | | |
|---|---|---|---|
| 8,981,352 B2 | 3/2015 | Kamada et al. | |
| 9,236,581 B2 | 1/2016 | Kato et al. | |
| 2012/0248475 A1 | 10/2012 | Kamada et al. | |
| 2014/0042928 A1* | 2/2014 | Shikina | H05B 33/08 |
| | | | 315/291 |
| 2015/0048328 A1 | 2/2015 | Kato et al. | |
| 2016/0225318 A1* | 8/2016 | Choi | G09G 3/3258 |
| 2016/0268354 A1* | 9/2016 | Xiong | H01L 51/5072 |
| 2018/0358573 A1* | 12/2018 | Maeda | H01L 51/5221 |
| 2019/0325819 A1* | 10/2019 | Toyoda | H01L 27/3246 |
| 2020/0066815 A1* | 2/2020 | Choi | H01L 27/3246 |
| 2020/0144306 A1* | 5/2020 | Wang | H01L 27/3248 |
| 2021/0091158 A1* | 3/2021 | Kasahara | H05B 33/06 |

FOREIGN PATENT DOCUMENTS

| | | |
|---|---|---|
| JP | 2012-216338 A | 11/2012 |
| JP | 2014-197466 A | 10/2014 |
| JP | 2014-232631 A | 12/2014 |

\* cited by examiner

*Primary Examiner* — Amr A Awad
*Assistant Examiner* — Donna V Bocar
(74) *Attorney, Agent, or Firm* — Venable LLP

(57) ABSTRACT

A display apparatus comprising a pixel provided on a substrate, the pixel including a first subpixel, a second subpixel, and a third subpixel which are arranged to be adjacent to each other and are configured to generate light components of colors different from each other, and the first, second and third subpixels comprise an organic compound layer including a light emission layer, wherein letting I1, I2, and I3 be driving current amounts of the first, second and third subpixels when generating white light of a predetermined luminance, if I1>I2>I3 holds, a current leakage between the first and third subpixels is limited as compared to that between the second and third subpixels.

16 Claims, 9 Drawing Sheets

F I G. 2A
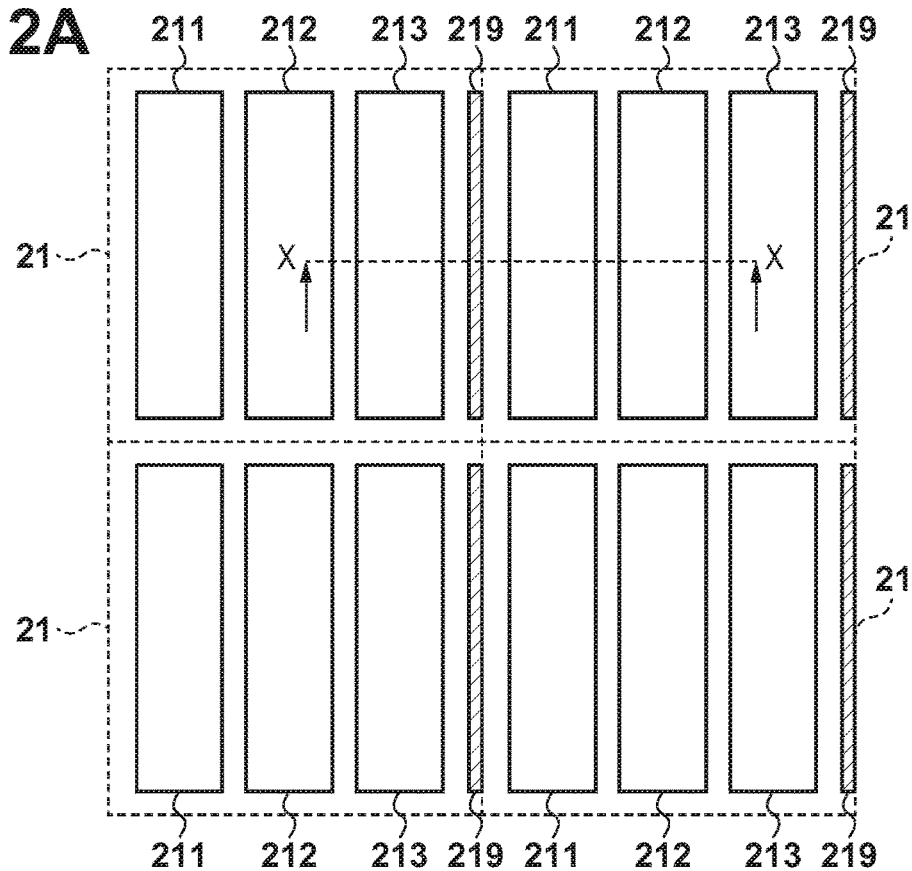
F I G. 2B
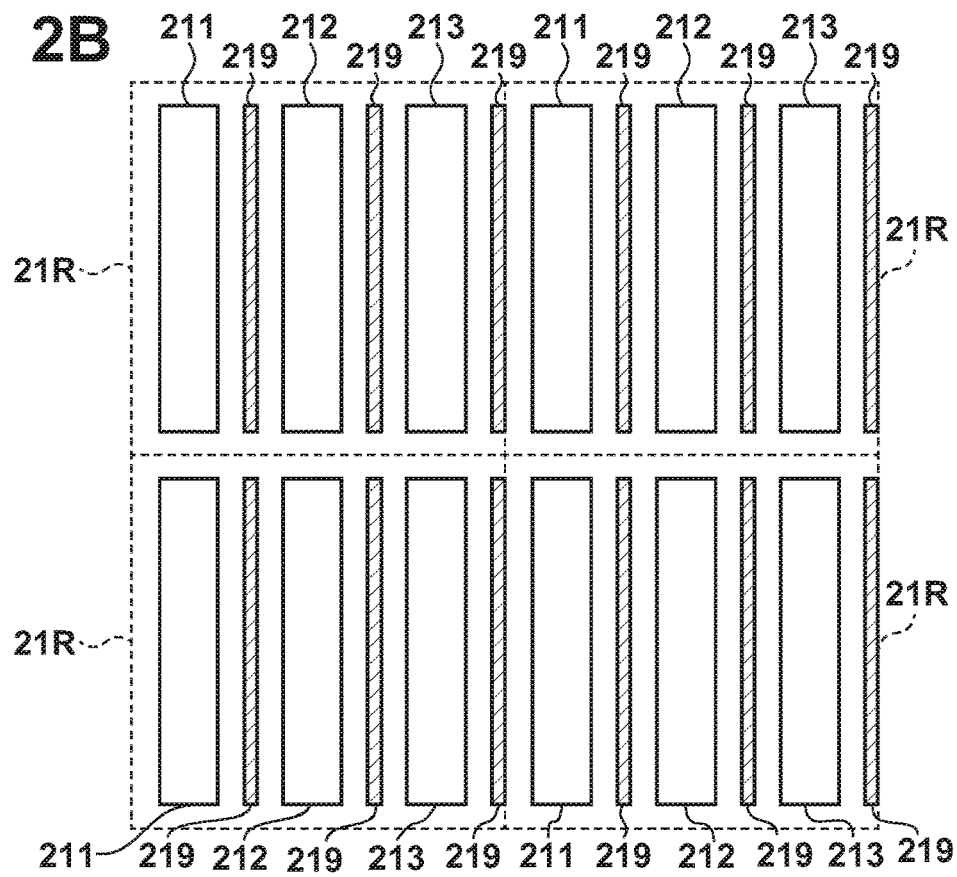

DISPLAY APPARATUS AND ELECTRIC APPARATUS WITH CONTROLLED CURRENT LEAKAGE AMONG SUBPIXELS

BACKGROUND OF THE INVENTION

Field of the Invention

The present invention mainly relates to a display apparatus including an organic light emission layer.

Description of the Related Art

Some display apparatuses used as the electronic viewfinder of a camera, the display of a TV, the display panel of a portable terminal, and the like use an organic light-emitting diode in a pixel. Such a display apparatus is also called an organic EL display or the like. As an example, the display apparatus includes a pixel array in which a plurality of pixels are arranged, and each pixel is provided with a plurality of subpixels configured to generate light components of colors different from each other such as blue light, green light, and red light. The display apparatus can display a variety of colors on a pixel basis by combining the emission light components of the plurality of subpixels and adjusting the light amounts.

Japanese Patent Laid-Open Nos. 2012-216338 and 2014-232631 describe that to reduce a leakage current that can be generated between subpixels adjacent to each other, a structure configured to limit the leakage current is provided between the subpixels. On the other hand, if such structures are provided in all boundary portions between the subpixels adjacent to each other, the light emission amounts of the individual subpixels may be decreased, and the light emission efficiency or luminance may lower. Hence, there is room for improvement of the structure.

SUMMARY OF THE INVENTION

It is an object of the present invention to provide a technique advantageous in implementing both reduction of a leakage current between subpixels adjacent to each other and improvement of the light emission efficiency of individual subpixels.

One aspect of the present invention is a display apparatus comprising a plurality of pixels arranged on a substrate, in which at least one of the plurality of pixels includes a first subpixel, a second subpixel, and a third subpixel which are arranged to be adjacent to each other and are configured to generate light components of colors different from each other, and the first subpixel, the second subpixel, and the third subpixel comprise an organic compound layer including a light emission layer, wherein in the pixel, letting I1, I2, and I3 be driving current amounts of the first subpixel, the second subpixel, and the third subpixel of the pixel when generating white light of a predetermined luminance, if I1>I2>I3 holds, a current leakage between the first subpixel and the third subpixel is limited as compared to a current leakage between the second subpixel and the third subpixel.

Further features of the present invention will become apparent from the following description of exemplary embodiments (with reference to the attached drawings).

BRIEF DESCRIPTION OF THE DRAWINGS

FIGS. 1A, 1B1, and 1B2 are views for explaining an example of the structure of a display apparatus;

FIGS. 2A and 2B are views for explaining an example and a reference example of the form of a pixel arrangement;

DESCRIPTION OF THE EMBODIMENTS

Figure 1A:
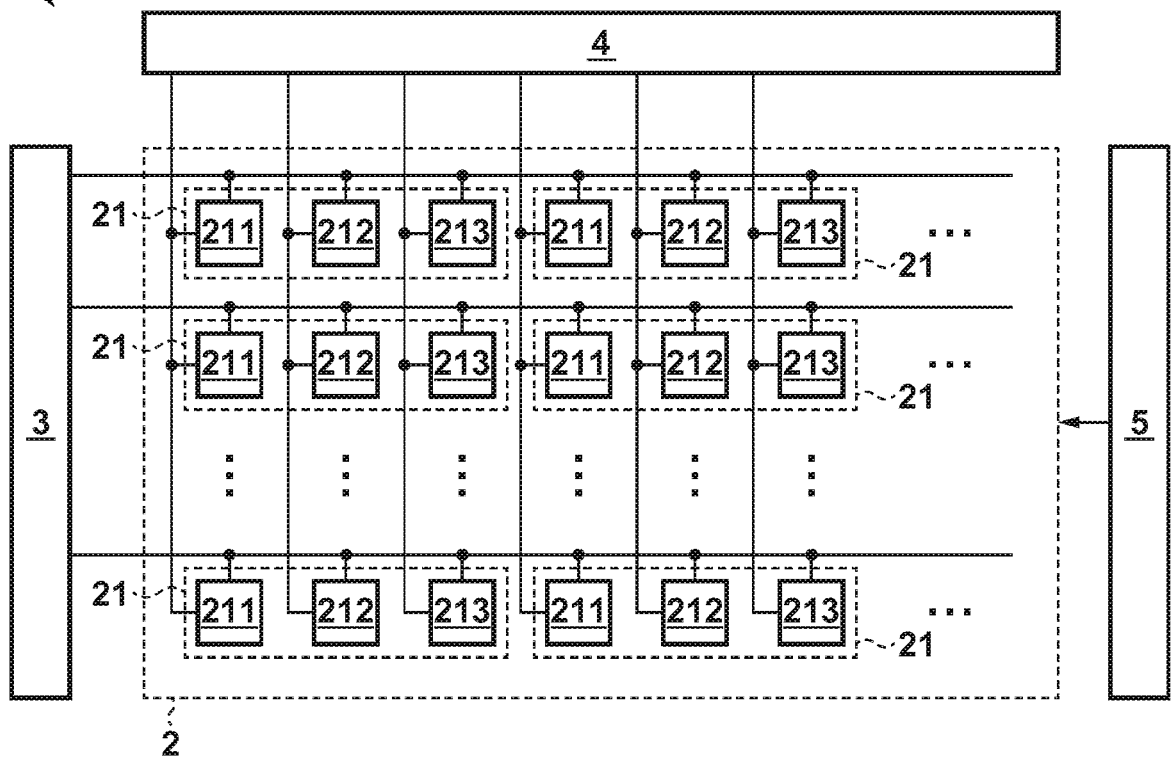

Preferred embodiments of the present invention will now be described with reference to the accompanying drawings. Note that the drawings are shown merely for the purpose of explaining structures or arrangements, and the dimensions of members shown in the drawings do not necessarily reflect the actuality. In addition, the same reference numerals denote the same members or the same constituent elements in the drawings, and a description of repetitive contents will be omitted below. Furthermore, expressions such as "above" and "below" in the explanation of the drawings indicate the relative positional relationship between the elements.

First Embodiment

FIG. 1A shows an example of the arrangement of a display apparatus 1 according to the first embodiment. In this embodiment, the display apparatus 1 is an organic electro-luminescence display, and includes a pixel array 2, a scanning signal driver 3, an information signal driver 4, and a voltage supply unit 5.

The pixel array 2 includes a plurality of pixels 21 that are arranged to form a plurality of rows and a plurality of columns. In this embodiment, each pixel 21 includes subpixels 211 to 213 that are arranged to be adjacent to each other and can generate light components of colors different from each other. That is, a plurality of subpixels 211, a plurality of subpixels 212, and a plurality of subpixels 213 are arrange to be adjacent to each other. In this embodiment, the subpixel (first subpixel) 211 can generate blue light, the subpixel (second subpixel) 212 can generate green light, and the subpixel (third subpixel) 213 can generate red light. Each pixel 21 can emit light of a variety of colors by combining the emission light components of the subpixels 211 to 213 and adjusting the light amounts, as will be described later in detail.

The scanning signal driver 3 supplies a scanning signal SIG3 to the plurality of subpixels 211 to 213 on a row basis via a signal line provided for each row. The information signal driver 4 supplies an information signal SIG4 to the plurality of subpixels 211 to 213 on a column basis via a signal line provided for each column. The voltage supply unit 5 supplies a predetermined voltage (for example, a ground voltage) to the plurality of subpixels 211 to 213. With this arrangement, the subpixels 211 to 213 of each pixel 21 can individually be driven.

Figure 1A:
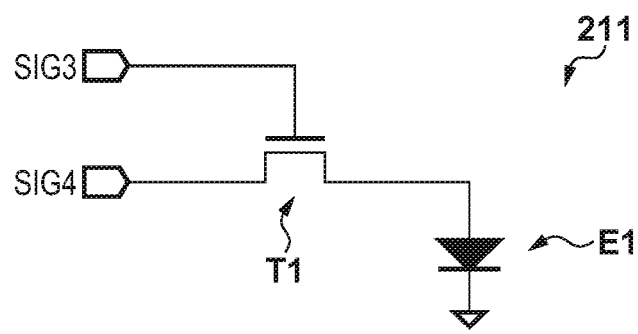
Figure 1A:
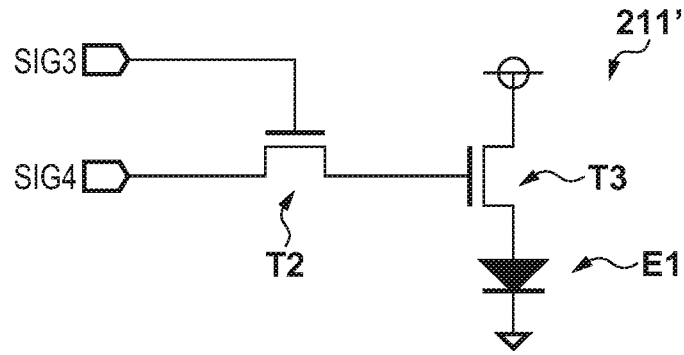

FIG. 1B1 shows an example of the arrangement of the subpixel 211. The subpixel 211 includes an organic light-emitting diode (OLED) E1 and a transistor T1. The organic light-emitting diode E1 is formed by an organic compound layer that emits light in accordance with voltage application, as will be described later in detail. In this embodiment, a thin film transistor is used as the transistor T1. The transistor T1 is connected to the anode of the organic light-emitting diode E1 via the source terminal, receives the scanning signal SIG3 via the gate terminal, and receives the information signal SIG4 via the drain terminal.

The cathode of the organic light-emitting diode E1 is grounded by the voltage supply unit 5.

In this arrangement, when selected by receiving the scanning signal SIG3 from the scanning signal driver 3, the subpixel 211 is driven in accordance with the reception of the information signal SIG4 of activation level from the information signal driver 4, and the organic light-emitting diode E1 thus emits light. As an example, in a case in which the transistor T1 is an n-channel transistor, when both the scanning signal SIG3 and the information signal SIG4 are at high level, the transistor T1 is turned on, and the organic light-emitting diode E1 is driven to emit light. The amount of emission light of the organic light-emitting diode E1 complies with the signal value of the information signal SIG4. The arrangement of the subpixel 211 has been described here. This also applies to the remaining subpixels 212 and 213.

Blue, green, and red color filters are provided in the subpixels 211, 212, and 213 to cover the organic light-emitting diodes E1, as will be described later in detail. When the organic light-emitting diode E1 emits light, light components of colors corresponding to the color filters are emitted from the subpixels 211, 212, and 213.

The example shown in FIG. 1B1 exemplifies the arrangement including the single transistor T1 as the subpixel 211 for descriptive convenience. However, the present invention is not limited to this. For example, as shown by a subpixel 211' in FIG. 1B2, transistors T2 and T3 may be used in place of the transistor T1. In this example, the transistor T2 is connected to the gate terminal of the transistor T3 via the source terminal, receives the scanning signal SIG3 via the gate terminal, and receives the information signal SIG4 via the drain terminal. In addition, the transistor T3 is arranged between a power supply potential and a ground potential and is connected in series with the organic light-emitting diode E1. Such an arrangement can also implement the same function as the subpixel 211, and this also applies to the remaining subpixels 212 and 213.

FIG. 2A is a schematic view showing the top surface layout of the pixels 21 according to this embodiment. In this embodiment, the subpixels 211 to 213 of each pixel 21 are juxtaposed in one direction in a planar view (at a viewpoint in a direction perpendicular to the arrangement direction of the plurality of pixels 21 or in a top view). Such an arrangement is also called a stripe arrangement. In this embodiment, the subpixels 211 to 213 are arranged in the row direction.

Each pixel 21 further includes a separation structure 219. In this embodiment, the separation structure 219 is arranged between the subpixel 211 and the subpixel 213 to limit (or suppress or shield) a leakage current that can be generated between them, as will be described later in detail. Note that the separation structure 219 may be expressed as a shielding structure, a leakage current suppressing structure, a subpixel insulating structure, or the like.

Figure 3:
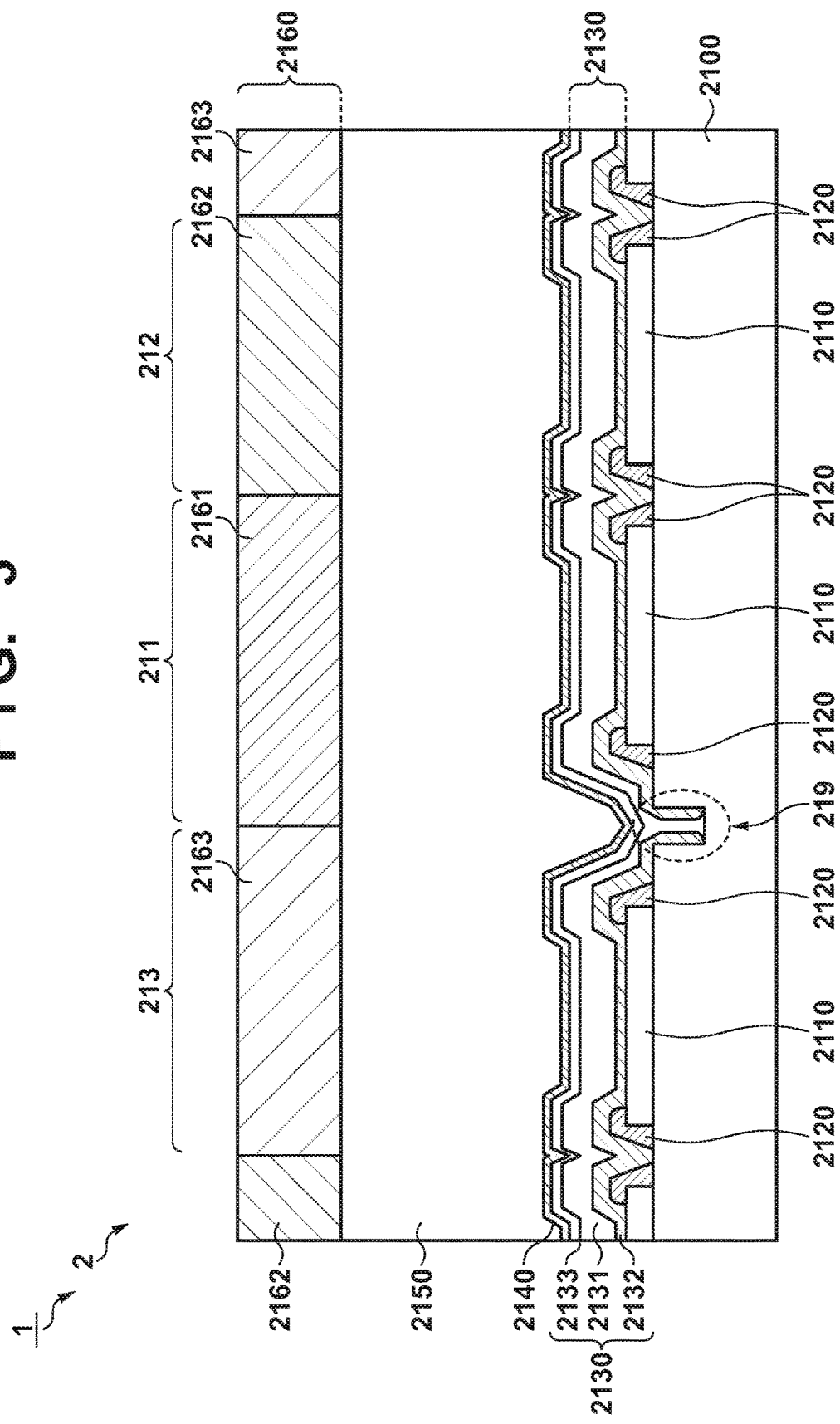
FIG. 3 is a view for explaining an example of a pixel structure.

FIG. 3 is a schematic view showing a sectional structure taken along a line X-X in FIG. 2A. In this embodiment, the display apparatus 1 includes a substrate 2100, a plurality of lower electrodes 2110, insulating members 2120, an organic compound layer 2130, an upper electrode 2140, a sealing layer 2150, and a color filter layer 2160, and these form the pixel array 2.

A predetermined plate-shaped base member used to form the elements of the pixels 21 is used as the substrate 2100. For example, a glass substrate, a silicon substrate, or the like is used. The elements are arranged on the upper surface of the substrate 2100 or above the substrate 2100. For example, although not illustrated here, the above-described transistor T1 is formed on the upper surface of the substrate 2100.

The plurality of lower electrodes 2110 are arranged on the substrate 2100. A known conductive member is used as each of the plurality of lower electrodes 2110. For example, a metal such as aluminum, silver, or titanium, an alloy thereof, a compound thereof, or the like is used. Each lower electrode 2110 is electrically connected to the transistor T1 via a contact plug (not shown here) made of tungsten or the like. The lower electrodes 2110 can be formed by a known deposition method such as sputtering.

The insulating members 2120 are provided to surround the peripheral portions of the plurality of lower electrodes 2110 in a planar view, and define light emission regions in the organic compound layer 2130 to be described later. The insulating members 2120 can be formed by, for example, forming an insulating film to cover the plurality of lower electrodes 2110, forming a resist member above the peripheral portion of each lower electrode 2110 on the insulating film, and performing known etching using the resist member. An example of etching at this time is plasma etching.

The organic compound layer 2130 is extended along the upper surface of the substrate 2100 throughout the region where the pixel array 2 should be formed to cover all of the plurality of lower electrodes 2110 (provided while being spread in the arrangement direction in a planar view). The organic compound layer 2130 is formed by stacking a plurality of layers, and in this embodiment, includes a light emission layer 2131, an anode-side function layer 2132, and a cathode-side function layer 2133. The anode-side function layer 2132 is arranged under the light emission layer 2131, and as the anode-side function layer 2132, for example, a hole injection layer, a hole transport layer, and an electron blocking layer are arranged in order from the lower layer side to the upper layer side. In addition, the cathode-side function layer 2133 is arranged on the light emission layer 2131, and as the cathode-side function layer 2133, for example, an electron injection layer, an electron transport layer, and a hole blocking layer are arranged in order from the upper layer side to the lower layer side. When a predetermined voltage is applied to the organic compound layer 2130, holes are supplied from the anode-side function layer 2132 to the light emission layer 2131, and electrons are supplied from the cathode-side function layer 2133 to the light emission layer 2131. In the light emission layer 2131, light of a predetermined wavelength is generated by recombination of the holes and the electrons.

The upper electrode 2140 is extended, above the plurality of lower electrodes 2110, along the upper surface of the substrate 2100 to cover the organic compound layer 2130. A conductive member having light transmittance is used as the upper electrode 2140 so as to allow the emission light of the organic compound layer 2130 to pass the upper electrode 2140, and, for example, tin oxide, indium oxide, indium tin oxide, indium zinc oxide, or the like is used. Note that as another example of the upper electrode 2140, a thin metal film (the film thickness is about 1 [nm] to 30 [nm]) through which the emitted light can sufficiently pass may be used, and, for example, gold, platinum, silver, aluminum, chromium, magnesium, an alloy thereof, or the like may be used. The upper electrode 2140 can be formed by a known deposition method such as sputtering.

The plurality of lower electrodes 2110, the organic compound layer 2130, and the upper electrode 2140 described above form the organic light-emitting diodes E1. In this embodiment, the plurality of lower electrodes 2110 provided on the substrate 2100 and under the organic light-emitting diodes E1 correspond to the anodes of the organic light-emitting diodes E1, and the upper electrode 2140 provided on the organic light-emitting diodes E1 corresponds to the cathodes of the organic light-emitting diodes E1. Each lower electrode 2110 corresponds to one of the subpixels 211 to 213 (in other words, each of the subpixels 211 to 213 includes the lower electrode 2110). The organic compound layer 2130 and the upper electrode 2140 are extended along the upper surface of the substrate 2100 to cover the plurality of lower electrodes 2110 (across the plurality of lower electrodes 2110) throughout the region where the pixel array 2 should be formed. For example, when a predetermined voltage is applied across the upper electrode 2140 and the lower electrode 2110 corresponding to the subpixel 211, light is generated in a part of the organic compound layer 2130 corresponding to the subpixel 211. This light is transmitted through the upper electrode 2140 and emitted upward as the emission light of the subpixel 211.

The sealing layer 2150 seals the elements of the pixels 21 formed on the substrate 2100. An insulating member having light transmittance is used as the sealing layer 2150 so as to allow the emission light of the organic compound layer 2130 to pass the sealing layer 2150, and, for example, silicon oxide, silicon nitride, silicon oxynitride, aluminum oxide, or the like can be used. The sealing layer 2150 can be formed by a known deposition method such as CVD (Chemical Vaper Deposition), ALD (Atomic Layer Deposition), or sputtering.

The color filter layer 2160 is arranged on the sealing layer 2150, and includes a plurality of color filters capable of passing components of wavelengths different from each other in the emission light of the organic compound layer 2130. In this embodiment, the color filter layer 2160 includes a blue filter 2161, a green filter 2162, and a red filter 2163. The filters 2161 to 2163 are arranged to correspond to the subpixels 211 to 213, respectively. For example, as for the subpixel 211, when the emission light of the organic compound layer 2130 passes through the filter 2161, blue light is emitted. The filters 2161 to 2163 can be formed in order by repetitively performing a step of applying a filter material by, for example, spin coating and a step of exposing and developing the filter material.

A known organic compound is used for the organic compound layer 2130. Note that it is only necessary to form most parts of the organic compound layer 2130 by the organic compound, and an inorganic substance may be used partially.

The light emission layer 2131 may be made of a light emission material that can emit light upon receiving a voltage or a material obtained by doping a predetermined host material with a light emission material, or may be formed by stacking two or more layers. Examples of the light emission material are fused ring compounds (for example, fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-hydroxyquinolinato) aluminum, iridium complexes, platinum complexes, rhenium complexes, copper complexes, europium complexes, ruthenium complexes, and polymeric derivatives such as poly(phenylene vinylene) derivatives, poly(fluorene) derivatives, and poly(phenylene) derivatives. In addition, examples of the host material are carbazole derivatives, dibenzofuran derivatives, dibenzothiophene derivatives, organic aluminum complexes such as tris(8-hydroxyquinolinato) aluminum, and organic beryllium complexes in addition to aromatic hydrocarbon compounds and derivatives thereof.

In the anode-side function layer 2132, a material with an electron affinity of 5.0 [eV] or more is preferably used for the hole injection layer. A material with a relatively high hole mobility is preferably used for the hole transport layer. A material whose LUMO (Lowest Unoccupied Molecular Orbital) is relatively close to the vacuum level (LUMO is shallow) is preferably used for the electron blocking layer.

In the cathode-side function layer 2133, a material with a relatively small work function is preferably used for the electron injection layer. A material with a relatively high electron mobility is preferably used for the electron transport layer. A material whose HOMO (Highest Occupied Molecular Orbital) is relatively far from the vacuum level (HOMO is deep) is preferably used for the hole blocking layer.

Examples of the material of the electron injection layer are alkali metals, alkali earth metals, and compounds thereof such as lithium fluoride (LiF), potassium fluoride (KF), and magnesium oxide (MgO). For example, a cesium compound such as cesium carbonate can be relatively easily handled in the atmosphere and is therefore suitably used. In addition, for the electron injection layer, a material obtained by doping a predetermined organic compound with the above-described alkali metal as a donor (electron donative dopant) can also be used. For example, a material obtained by doping an aluminum quinolinol complex or a phenanthroline compound with the alkali metal or the like is suitably used.

In the above-described structure in which the organic compound layer 2130 is extended, when a certain subpixel is driven, a part of the driving current may leak to another adjacent subpixel. A case in which the subpixel 211 and the adjacent subpixel 212 are simultaneously driven to generate light of a predetermined color in each pixel 21 will be examined below as an example.

Assume that, for example, a voltage V1 is applied across the upper electrode 2140 and the lower electrode 2110 (to be referred to as a "lower electrode $2110_1$," for the sake of distinction) corresponding to the subpixel 211. In a portion (to be referred to as, for example, a portion $2130_1$) of the organic compound layer 2130 between the lower electrode $2110_1$ and the upper electrode 2140, ideally, light of an amount corresponding to the voltage V1 is generated. Assume that, for example, a voltage V2 (<V1) is applied across the upper electrode 2140 and the lower electrode 2110 (to be referred to as a "lower electrode $2110_2$," for the sake of distinction) corresponding to the subpixel 212. In a portion (to be referred to as, for example, a portion $2130_2$) of the organic compound layer 2130 between the lower electrode $2110_2$ and the upper electrode 2140, ideally, light of an amount corresponding to the voltage V2 is generated.

However, since the current amount in the portion $2130_1$ and that in the portion $2130_2$ are different from each other, a current leakage may occur between them. In the above-described example in which V1>V2, since the driving current of the portion $2130_1$ is larger than the driving current of the portion $2130_2$, a part of the driving current of the portion $2130_1$ may leak to the portion $2130_2$. As a result, the subpixel 211 is driven by a driving force smaller than the target driving force, and the subpixel 212 is driven by a driving force larger than the target driving force. This also applies to the remaining subpixel 213.

That is, in a case in which the subpixels 211 to 213 are driven to emit light of a desired color from a given pixel 21, the current leakage as described above, which may occur between the subpixels 211 to 213, may cause a situation in which light of another color different from the desired color is emitted.

As a measure against the current leakage, providing structures configured to limit the leakage current in the boundary portions between the subpixels 211 to 213 can be considered. On the other hand, providing such a structure may decrease the effective area of the subpixels 211 to 213. For this reason, when such structures are provided in all the boundary portions, the light emission amounts of the individual subpixels 211 to 213 unnecessarily decrease, and the light emission efficiency or luminance lowers. Hence, in this embodiment, the separation structures 219 configured to limit the leakage current are provided only in some of the boundary portions between the subpixels 211 to 213, where the leakage current is relatively large.

Here, the effective area indicates the area of a region capable of emitting light in a certain subpixel in a planar view. However, it may equivalently be evaluated by the ratio (opening ratio) of the width of the region capable of emitting light in each of the subpixels 211 to 213 with respect to the arrangement pitch of the pixels 21. In addition, the region capable of emitting light in each of the subpixels 211 to 213 substantially corresponds to a region that overlaps a portion of the upper surface of the lower electrode 2110 exposed by the insulating member 2120 in a planar view.

As shown in FIG. 3, the separation structure 219 is provided by forming a trench portion (concave portion) in the upper surface of the substrate 2100 and filling the trench portion with the organic compound layer 2130. As for the method of forming the separation structure 219, for example, the trench portion is formed in the upper surface of the substrate 2100 by plasma etching, and after that, a plurality of layers that constitute the organic compound layer 2130 are sequentially formed on the substrate 2100 by vacuum deposition. In this embodiment, the anode-side function layer 2132 that is the part of the organic compound layer 2130 on the lower layer side is formed in a shape thinned or divided in the trench portion (so-called "step disconnection" occurs). This increases the electrical resistance between the subpixels in the organic compound layer 2130 and limits the current leakage that may occur between them.

In this embodiment, the separation structure 219 is provided between the subpixels 211 and 213 where the leakage current is relatively large, and the separation structure 219 is not provided between the subpixels 211 and 212 where the leakage current is relatively small. This will be explained below.

In a case in which a given pixel 21 emits white light of a predetermined luminance, let I1 be the driving current amount of the subpixel 211 that emits blue light, I2 be the driving current amount of the subpixel 212 that emits green light, and I3 be the driving current amount of the subpixel 213 that emits red light. Here, when emitting white light, I1>I2>I3 holds in general. That is, the driving current amount I3 of the subpixel 213 that emits red light is relatively small. For this reason, the subpixel 213 is readily affected by the leakage current from the remaining subpixels. In particular, since the driving current amount difference is largest between the subpixels 211 and 213, the current leakage readily occurs.

In addition, the influence of the leakage current can also vary depending on whether the white light emitted from the pixel 21 has a high luminance (for example, about 500 [cd/m$^2$]) or a low luminance (for example, about 2 [cd/m$^2$]). The driving current amount of the subpixel 213 in a case in which white light of a low luminance is emitted is smaller by one or two orders of magnitude than the driving current amount of the subpixel 213 in a case in which white light of a high luminance is emitted. When emitting white light of a low luminance, the subpixel 213 is more readily affected by the leakage current. For example, in a case in which the separation structure 219 is not provided, the ratio ($I_{LEAK}/I_{DRV}$) of a leakage current $I_{LEAK}$ from the subpixel 211 to the subpixel 213 to a driving current amount $I_{DRV}$ of the subpixel 213 when emitting white light of a high luminance is about 0.4. On the other hand, when emitting white light of a low luminance is about 0.7. Hence, the lower the luminance of the white light emitted from the pixel 21 is, more reddish the emitted light becomes.

According to this embodiment, since the separation structure 219 is provided between the subpixels 211 and 213 where the current leakage readily occurs, the leakage current can appropriately be limited between the subpixels 211 and 213. On the other hand, since the separation structure 219 is not provided between the subpixels 211 and 212 and between the subpixels 212 and 213 where the current leakage hardly occurs, the effective area of each of the subpixels 211 to 213 is not unnecessarily reduced. It is therefore possible to appropriately ensure the light emission amount of each of the subpixels 211 to 213.

FIG. 2B shows the top surface layout of pixels 21R as a reference example, like FIG. 2A. In the reference example, the separation structures 219 are provided in all boundary portions between the subpixels 211 to 213 in the row direction. For this reason, the effective area of each of the subpixels 211 to 213 is reduced. To the contrary, according to this embodiment (see FIG. 2A), it is possible to make the effective area of the subpixel 211 close to the effective area of the subpixel 212 and also make the effective area of the subpixel 212 close to the effective area of the subpixel 213, as compared to the reference example (see FIG. 2B).

Hence, according to this embodiment (see FIG. 2A), it is possible to increase the effective area of each of the subpixels 211 to 213 and reduce the leakage current between the subpixels 211 to 213 and also improve the light emission efficiency of each of the subpixels 211 to 213.

In this embodiment, the separation structure 219 is provided only between the subpixels 211 and 213 but not between the subpixels 211 and 212 and between the subpixels 212 and 213. However, the arrangement position of the separation structure 219 can be changed as needed. For example, in a case in which not only the leakage current from the subpixel 211 that generates blue light to the subpixel 213 that generates red light but also the leakage current to the subpixel 212 that generates green light is relatively large, the separation structure 219 may be provided between the subpixels 211 and 212 as well.

As another embodiment, the width of the separation structure 219 (the width in a direction parallel to the upper surface of the substrate 2100, that is, in the horizontal direction) can also be changed. When the width of the separation structure 219 is increased, the leakage current can effectively be limited, and on the other hand, the effective area of each subpixel is reduced. In addition, when the width of the separation structure 219 is decreased, the effective area can be ensured, and on the other hand, the effect of limiting the leakage current is suppressed.

Hence, the separation structures 219 whose widths are different from each other may be provided in all boundary portions between the subpixels 211 to 213. For example, let W1 be the width of the separation structure 219 between the subpixels 211 and 213, W2 be the width of the separation structure 219 between the subpixels 211 and 212, and W3 be the width of the separation structure 219 between the subpixels 212 and 213. At this time, the separation structures 219 are provided such that W1>W2>W3 (or W1>W2≥W3) holds. For example, when the arrangement pitch of the pixels 21 falls within the range of 2.0 [μm] (inclusive) to 8.0 [μm] (inclusive), the trench portions used to provide the separation structures 219 are preferably provided in a width of 0.1 [μm] or more and in a width of 1.0 [μm] or less.

From this viewpoint, is can be said that it is only necessary to limit the current leakage between the subpixels 211 and 213 as compared to the current leakage between the subpixels 212 and 213. In this embodiment, when the separation structure 219 is provided, the organic compound layer 2130 is provided such that the current leakage between the subpixels 211 and 213 is limited as compared to the current leakage between the subpixels 212 and 213. Furthermore, the current leakage between the subpixels 211 and 212 is preferably limited as compared to the current leakage between the subpixels 212 and 213, as needed.

The ease of the current leakage between the subpixels 211 to 213 is preferably evaluated based on the driving current amount of each of the subpixels 211 to 213 when emitting white light of a predetermined luminance for each pixel 21. As described above, in this embodiment, the subpixel 213 is readily affected by the leakage current when emitting white light of a low luminance. Hence, the arrangement form of the separation structure 219 can be decided based on the magnitude relationship between the driving current amounts I1 to I3 of the subpixels 211 to 213 in a case in which white light of a luminance of, for example, 1 [cd/m$^2$] (inclusive) to 5 [cd/m$^2$] (inclusive) is emitted.

In this embodiment, the separation structure 219 is provided, thereby forming the anode-side function layer 2132 that is the part of the organic compound layer 2130 on the lower layer side into a thinned or divided shape. In this embodiment, the electrical resistance of the anode-side function layer 2132 between the subpixels 211 and 213 becomes larger than the electrical resistance between the subpixels 212 and 213. The electrical resistance of the anode-side function layer 2132 between the subpixels corresponds to the electrical resistance between the lower electrodes 2110 of the subpixels. Hence, for example, in the arrangement example shown in FIG. 1B1, the information signals SIG4 of signal values different from each other are supplied to the two subpixels adjacent to each other while supplying the scanning signal SIG3 of activation level, thereby evaluating the electrical resistance based on the leakage current generated between them.

In this embodiment, as the anode-side function layer 2132, the hole injection layer, the hole transport layer, and the electron blocking layer are arranged in order from the lower layer side to the upper layer side. However, forming at least one of them (in general, the hole injection layer as the lowermost layer) into a thinned or divided shape suffices. Note that as another embodiment, the hole transport layer and/or the electron blocking layer can be omitted as needed.

The structure of the pixel 21 (or each of the subpixels 211 to 213) is not limited to the example of this embodiment. For example, the positional relationship between the anode and the cathode of the organic light-emitting diode E1 may be reversed. That is, in this embodiment, the pixel 21 is formed by locating the anode on the lower side and locating the cathode on the upper side. However, as another embodiment, the cathode may be located on the lower side, and the anode may be located on the upper side. In this case, it is only necessary to thin or separate the cathode-side function layer 2133, that is, at least one of the electron injection layer, the electron transport layer, and the hole blocking layer by providing the separation structure 219. Note that as still another embodiment, the electron transport layer and/or the hole blocking layer can be omitted as needed.

As described above, according to this embodiment, it is possible to implement both reduction of the leakage current between the subpixels 211 to 213 and improvement of the light emission efficiency of the individual subpixels 211 to 213.

Second Embodiment

In the first embodiment, as shown in FIG. 2A, the pixel 21 is constituted in a form (stripe arrangement) in which the subpixels 211 to 213 are arranged in one direction. However, the arrangement of a pixel 21 is not limited to this. For example, subpixels 211 to 213 may be formed into another shape, and such subpixels 211 to 213 may be arranged in another form.

Figure 4A:
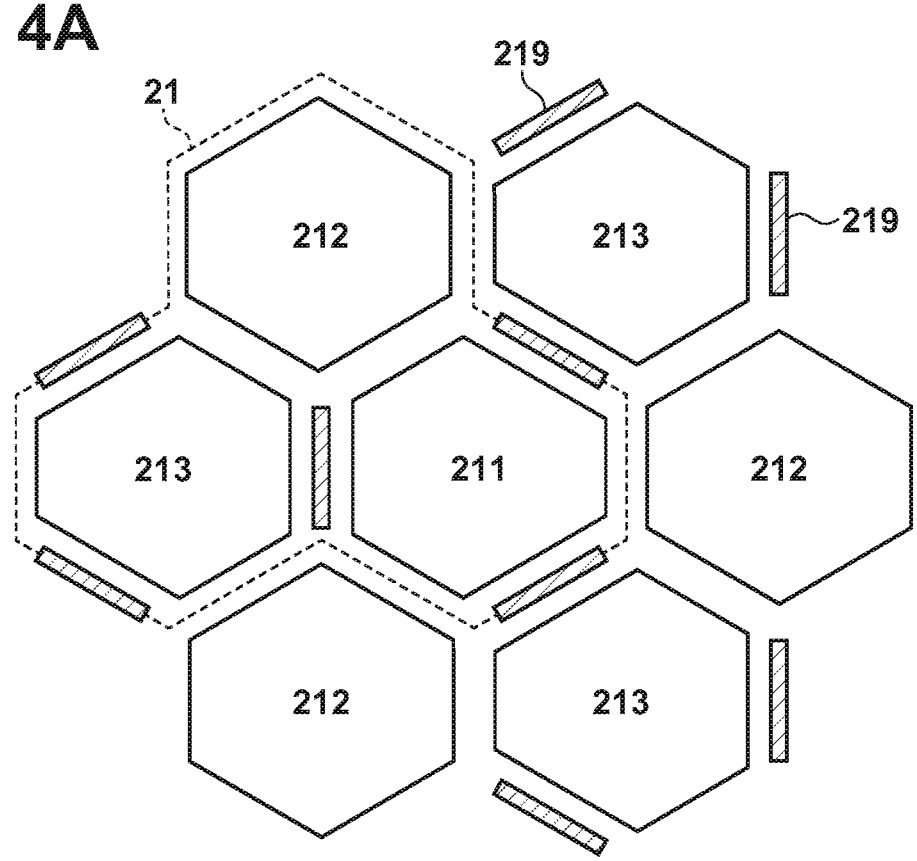
FIGS. 4A and 4B are views for explaining an example and a reference example of the form of a pixel arrangement.
Figure 4B:
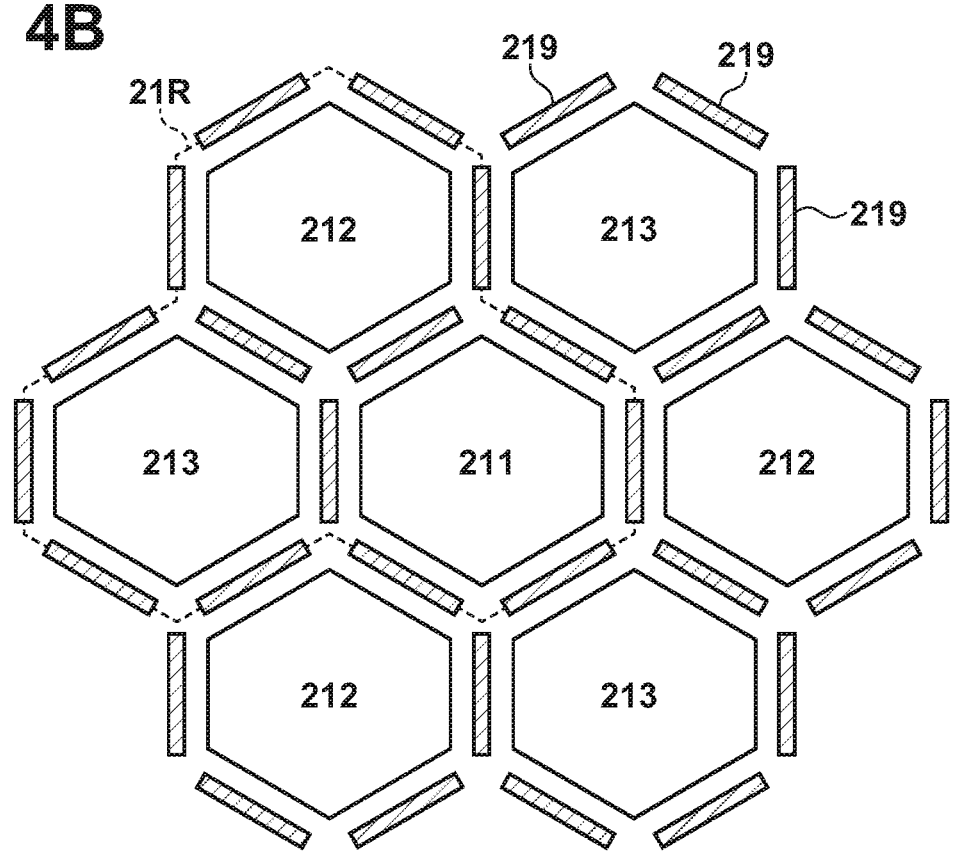

FIG. 4A is a schematic view showing the top surface layout of the pixels 21 according to the second embodiment. Each pixel 21 is constituted in a form (so-called delta arrangement) in which the subpixels 211 to 213 are each defined into a hexagonal shape and arranged. FIG. 4B shows the top surface layout of pixels 21R constituted in the delta arrangement as a reference example, like FIG. 4A.

As can be seen from FIG. 4A, in this embodiment, a separation structure 219 is provided between the subpixels 211 and 213 but not between the subpixels 211 and 212 and between the subpixels 212 and 213. On the other hand, in the reference example shown in FIG. 4B, the separation structures 219 are provided in all boundary portions between the subpixels 211 to 213. According to this embodiment (see FIG. 4A), it is possible to make the effective area of the subpixel 211 close to the effective area of the subpixel 212 and also make the effective area of the subpixel 212 close to the effective area of the subpixel 213, as compared to the reference example (see FIG. 4B). Hence, in this embodiment as well, the leakage current between the subpixels 211 to 213 can be reduced without unnecessarily reducing the effective area of each of the subpixels 211 to 213, the same effect as in the first embodiment can be obtained.

Note that in this embodiment, the delta arrangement has been exemplified as an example of the arrangement form of the pixels 21 different from the stripe arrangement. However, various arrangement forms such as a square arrangement, a Bayer arrangement, and a mosaic arrangement can be selected. In addition, all of the plurality of pixels 21 need not always be arranged in a predetermined form, and some of them may be arranged in an arrangement form different from the remaining pixels. Furthermore, each pixel 21 may be provided with another subpixel capable of emitting light of a color (for example, white, yellow, magenta, or cyan) other than blue, green, and red.

Third Embodiment

In the first embodiment, the separation structure 219 has been exemplified as the structure configured to limit the leakage current between the subpixels by thinning or dividing the anode-side function layer 2132 of the organic compound layer 2130. However, the structure that implements the same function is not limited to this.

Figure 5:
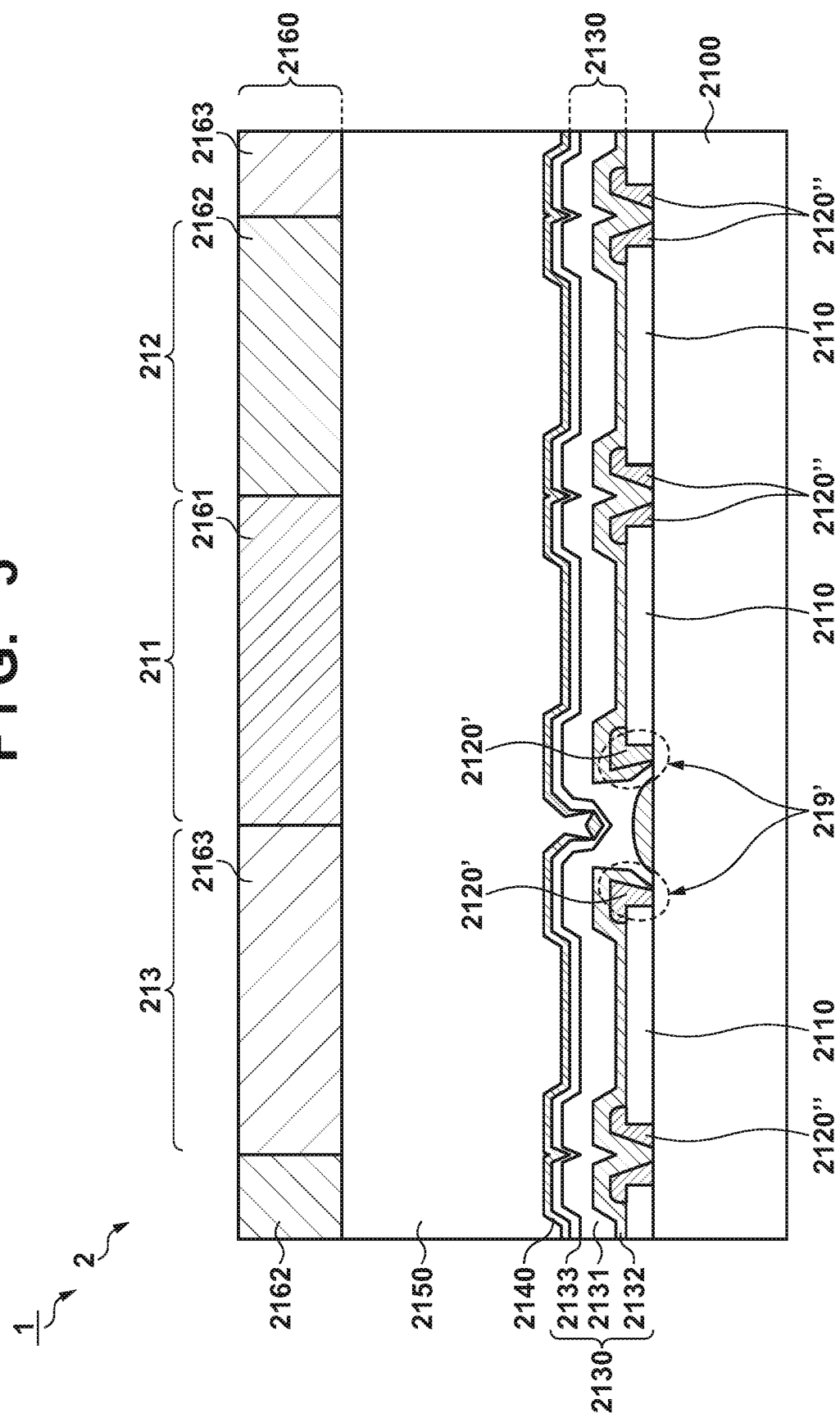
FIG. 5 is a view for explaining an example of a pixel structure.

FIG. 5 shows the sectional structure of a pixel array 2 of a display apparatus 1 according to the third embodiment, like FIG. 3 (first embodiment). In this embodiment, separation structures 219' are provided between subpixels 211 and 213.

The separation structures 219' are provided in the following way. First, a part of each of insulating members 2120 that surround the peripheral portions of lower electrodes 2110 is formed into an inverted tapered shape. More specifically, the insulating members 2120 are formed so as to include portions 2120' located between the lower electrode 2110 corresponding to the subpixel 211 and the lower electrode 2110 corresponding to the subpixel 213 and portions 2120" that are remaining portions. Each portion 2120' is provided to have a larger width (the width in the horizontal direction) as the distance from a substrate 2100 becomes long. That is, the portion 2120' has an inverted tapered shape. Each portion 2120" is provided to have a smaller width as the distance from the substrate 2100 becomes long. That is, the portion 2120" is the same as in FIG. 3 (see first embodiment). From another viewpoint, as shown in FIG. 5, the interior angle at the lower portion of the portion 2120' (the interior angle close to the boundary portion between the subpixels) is an obtuse angle (preferably, about 100 to 135 [degrees]), and the interior angle is an acute angle for the portion 2120".

The portions 2120' and 2120" can individually be formed. For example, the portions 2120' and 2120" can individually be formed by forming an insulating film to cover the plurality of lower electrodes 2110, forming a resist member above the peripheral portion of each lower electrode 2110 on the insulating film, and performing etching using the resist member. At this time, the etching conditions when forming the portions 2120' are different from the etching conditions when forming the portions 2120".

An organic compound layer 2130 is extended along the upper surface of the substrate 2100 to cover the plurality of lower electrodes 2110 and the above-described portions 2120' and 2120" of the insulating members 2120. The organic compound layer 2130 is provided by sequentially forming a plurality of layers of the organic compound layer 2130 by vacuum deposition, as in the first embodiment. At this time, since the portion 2120' has an inverted tapered shape, an anode-side function layer 2132 that is the part of the organic compound layer 2130 on the lower layer side is formed in a thinned or divided shape. Since this can increase the electrical resistance of the anode-side function layer 2132 between the subpixels 211 and 213 and limit the leakage current, the same effect as in the first embodiment can be obtained in this embodiment as well.

(Examples and Comparison Results)

The effects of the embodiment will be described below with reference to first to third examples according to the embodiment and first to sixth comparative examples for comparison.

In the first to third examples, three pixel arrays 2 in which the arrangement pitches of pixels 21 were 7.8 [μm], 6.3 [μm], and 5.0 [μm] were prepared, and subpixels 211 to 213 were arranged in the stripe arrangement (see FIG. 2A of the first embodiment).

A silicon substrate was used as a substrate 2100. An electrode formed by stacking an aluminum alloy and indium tin oxide was used as a lower electrode 2110. Tungsten was used as the material of a contact plug that connected an organic light-emitting diode E1 and a transistor T1. Silicon oxide was used for an insulating member 2120. In addition, a separation structure 219 was employed as a structure configured to limit the leakage current between the subpixels 211 and 213 (see FIG. 3 of the first embodiment).

In an anode-side function layer 2132, as a hole injection layer, a layer of a compound A1 below was formed into a thickness of 5 [nm]. As a hole transport layer, a layer of a compound A2 below was formed into a thickness of 30 [nm]. As an electron blocking layer, a layer of a compound A3 below was formed into a thickness of 10 [nm].

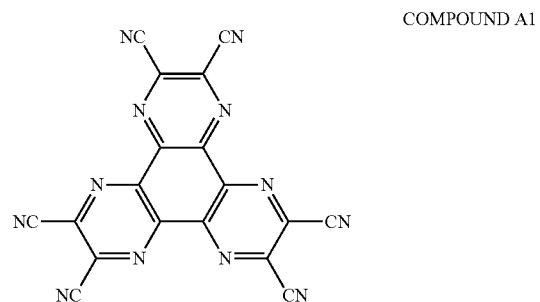

COMPOUND A1

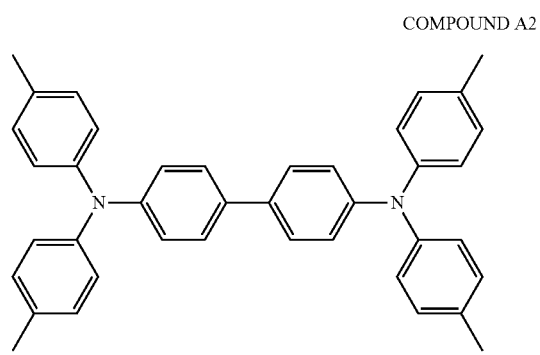

COMPOUND A2

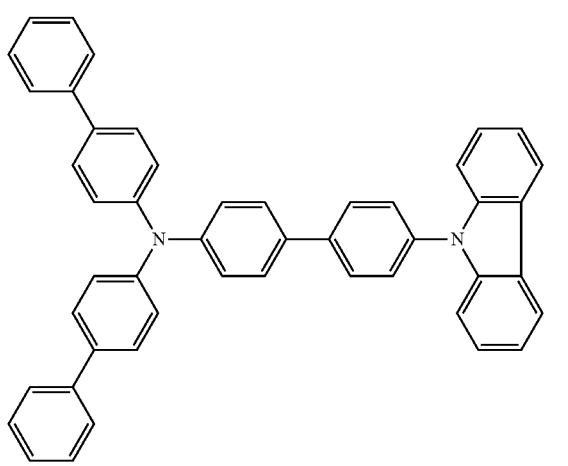

COMPOUND A3

-continued

COMPOUND A4

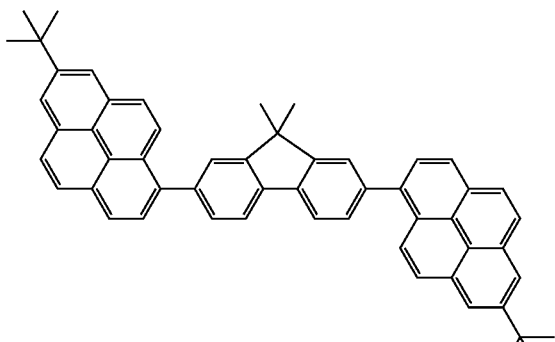

COMPOUND A5

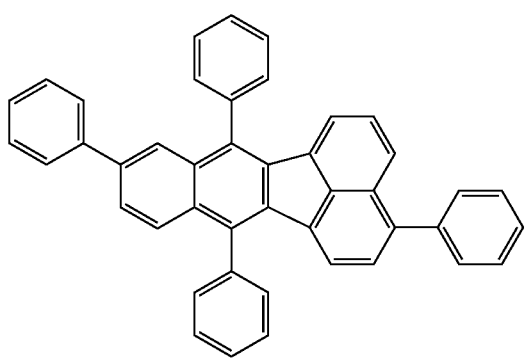

COMPOUND A6

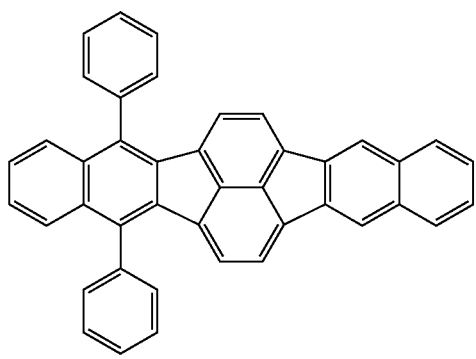

COMPOUND A7

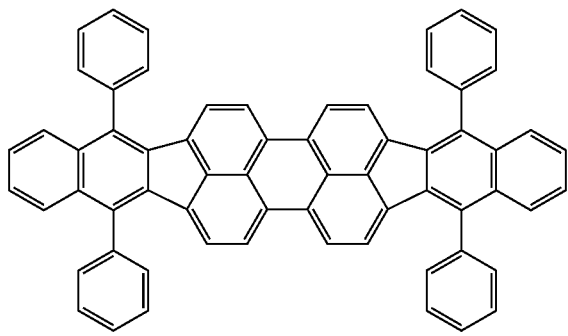

-continued

COMPOUND A8

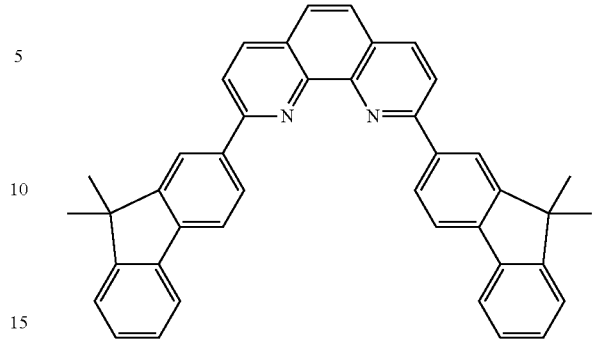

A light emission layer 2131 was formed by stacking two layers in the experimental examples. As one type of the two layers on the lower layer side, a layer in which a compound A4 (mass ratio: 98%) above serving as a host material was doped with a compound A6 (mass ratio: 1%) above and a compound A7 (mass ratio: 1%) above was formed into a thickness of 10 [nm]. As the other of the two layers, a layer in which the compound A4 (mass ratio: 97%) above serving as a host material was doped with a compound A5 (mass ratio: 3%) above was formed into a thickness of 15 [nm].

In a cathode-side function layer 2133, a hole blocking layer was omitted, and as an electron transport layer, a layer of a compound A8 above was formed into a thickness of 120 [nm]. Additionally, as an electron injection layer, a layer of LiF was formed into a thickness of 0.5 [nm].

As an upper electrode 2140, a film in which silver and magnesium were mixed (volume ratio: 1:1) was formed into a thickness of 10 [nm]. As a sealing layer 2150, silicon nitride was formed into a thickness of 3.0 [μm]. Here, the sealing layer 2150 was formed by CVD. After the upper surface of the sealing layer 2150 was planarized by CMP (Chemical Mechanical Polishing), a color filter layer 2160 was provided on the sealing layer 2150. Filters 2161 to 2163 of the color filter layer 2160 were formed in order by repetitively performing a step of applying a filter material and a step of exposing and developing the filter material.

Display apparatuses according to the first to third examples were produced in this way, and the electrical characteristics of the subpixels 211 to 213 in a case in which an arbitrary pixel 21 emitted white light of a low luminance were evaluated. For the subpixel 211 configured to generate blue light, the driving current amount per unit area was 0.6 [mA/cm$^2$]. For the subpixel 212 configured to generate green light, the driving current amount per unit area was 0.5 [mA/cm$^2$]. For the subpixel 213 configured to generate red light, the driving current amount per unit area was 0.1 [mA/cm$^2$].

In addition, display apparatuses according to the first to sixth comparative examples were produced in accordance with the same procedure as in the first to third examples: as the first comparative example, the arrangement pitch of pixels 21 were set to 7.8 [μm], and separation structures 219 were provided in all boundary portions between subpixels 211 to 213;

as the second comparative example, the arrangement pitch of pixels 21 were set to 6.3 [μm], and separation structures 219 were provided in all boundary portions between subpixels 211 to 213;

as the third comparative example, the arrangement pitch of pixels 21 were set to 5.0 [μm], and separation structures 219 were provided in all boundary portions between subpixels 211 to 213;

as the fourth comparative example, the arrangement pitch of pixels 21 were set to 7.8 [μm], and a separation structure 219 was not provided in any of the boundary portions between subpixels 211 to 213;

as the fifth comparative example, the arrangement pitch of pixels 21 were set to 6.3 [μm], and a separation structure 219 was not provided in any of the boundary portions between subpixels 211 to 213; and as the sixth comparative example, the arrangement pitch of pixels 21 were set to 5.0 [μm], and a separation structure 219 was not provided in any of the boundary portions between subpixels 211 to 213.

The comparison results between the first to third examples and the first to sixth comparative examples can be summarized as follows together with the above-described opening ratio (the ratio of the width of a region capable of emitting light in each of the subpixels 211 to 213 with respect to the arrangement pitch of the pixels 21).

TABLE 1

| | Arrangement pitch of pixels 21 [μm] | Boundary portion between subpixels 211 and 213 | Boundary portion between subpixels 211 and 212 | Boundary portion between subpixels 212 and 213 | Opening ratio [%] |
|---|---|---|---|---|---|
| First example | 7.8 | separation structure 219 | none | none | 61 |
| Second example | 6.3 | separation structure 219 | none | none | 53 |
| Third example | 5.0 | separation structure 219 | none | none | 43 |
| First comparative example | 7.8 | separation structure 219 | separation structure 219 | separation structure 219 | 44 |
| Second comparative example | 6.3 | separation structure 219 | separation structure 219 | separation structure 219 | 32 |
| Third comparative example | 5.0 | separation structure 219 | separation structure 219 | separation structure 219 | 18 |
| Fourth comparative example | 7.8 | none | none | none | 70 |
| Fifth comparative example | 6.3 | none | none | none | 64 |
| Sixth comparative example | 5.0 | none | none | none | 56 |

For example, in the first example, the separation structure 219 was provided only in the boundary portion between the subpixels 211 and 213. For this reason, when the first example and the first comparative example are compared, according to the first example, the opening ratio can be made larger than in the first comparative example in which the separation structures 219 are provided in all boundary portions between the subpixels 211 to 213. This also applies to the comparison between the second example and the second comparative example and the comparison between the third example and the third comparative example. Note that in all of the first to third examples and the first to third comparative examples, the white light that should be emitted from the pixel 21 did not become reddish.

On the other hand, in the fourth comparative example, since the separation structure 219 is not provided in any boundary portion between the subpixels 211 to 213, the opening ratio can be made larger than in the first example. However, when the pixel 21 emitted white light, the white light became reddish because of the leakage current generated between the subpixels 211 and 213, and it was confirmed that this was conspicuous as the luminance became lower. This also applies to the comparison between the second example and the fifth comparative example and the comparison between the third example and the sixth comparative example.

Additionally, when the display apparatus 1 (see FIG. 4A) according to the second embodiment and the display apparatus 1 (see FIG. 5) according to the third embodiment were also produced and evaluated, the same effects as in the first to third examples were confirmed. In particular, in the display apparatus 1 (see FIG. 5) according to the third embodiment, it was confirmed that the upper electrode 2140 was also thinned or divided in the boundary portion between the subpixels 211 and 213, and the leakage current could more appropriately be limited between them.

(Modifications)

Several preferred embodiments have been described above. However, the present invention is not limited to these embodiments, and they may partially be modified or combined without departing from the scope of the present invention. For example, in the example shown in FIG. 1A, the subpixels 211 to 213 of the pixels 21 are arranged in the same columns, and the scanning signal SIG3 is supplied to them common signal lines. However, the present invention is not limited to this form. For example, the scanning signal SIG3 may individually be supplied to the subpixels 211 to 213 via signal lines different from each other.

In addition, the arrangement of the subpixels 211 and the like is not limited to the example shown in FIG. 1B1 or 1B2. Each subpixel may further be provided with a compensation circuit of the like configured to compensate for a luminance unevenness. In addition, in each subpixel, a thin film transistor is used as the transistor T1, as described above. However, another switch element such as a MOS transistor or a junction transistor may be used in place of the thin film transistor.

Additionally, in the example shown in FIG. 3, the subpixels 211 to 213 are provided with the filters 2161 to 2163 as the color filter layer 2160. However, the function of the color filter layer 2160 may be provided in another element, and the color filter layer 2160 may be omitted. For example, the sealing layer 2150 may have the function of the color filter layer 2160, or the light emission material of the light emission layer 2131 may be changed between the subpixels 211 to 213.

In the above-described embodiments, a form in which the separation structures 219 (or 219') are provided for all of the plurality of pixels 21 has been described. However, the separation structures 219 of some pixels 21 may be omitted as needed. That is, it is only necessary to apply the separation structure 219 to at least some or at least one of the plurality of pixels 21.

(Application Examples)

The display apparatus 1 according to the above-described embodiments is applicable to a variety of electric apparatuses such as the electronic viewfinder of a camera, the display of a TV, and the display panel of a portable device.

Figure 6A:
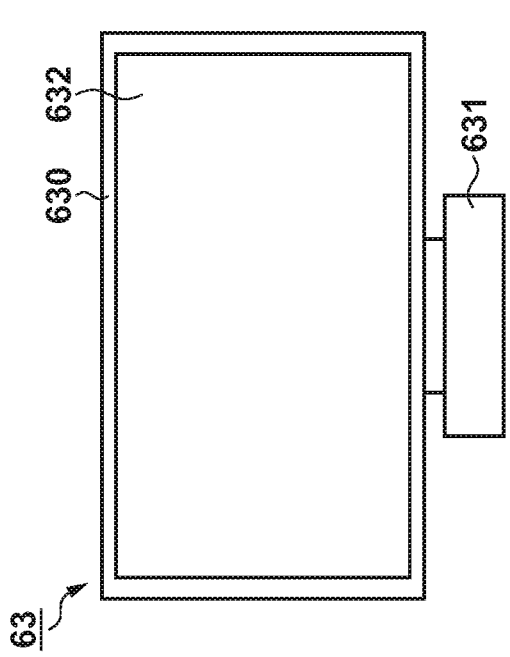
FIGS. 6A to 6D are views for explaining application examples of the display apparatus.

FIG. 6A is a schematic view of an image capturing apparatus 61. The image capturing apparatus 61 includes an operation unit 611, a rear display 612, and an electronic viewfinder 613, which are attached to a housing 610. The user can capture a desired object using the operation unit 611 and confirm, on the rear display 612, an image obtained by the image capturing. The display apparatus 1 is applicable to the electronic viewfinder 613. When performing image capturing, the user can confirm the object and the peripheral environment using the electronic viewfinder 613. In this case, the display apparatus 1 can further display pieces of information (for example, pieces of information necessary for appropriately implementing image capturing such as the intensity of external light and the moving speed of the object) associated with the object and the peripheral environment and notify the user of them. Note that the concept of the image capturing apparatus 61 includes not only the camera having the image capturing function as the main function but also a device auxiliarily having the image capturing function.

Figure 6B:
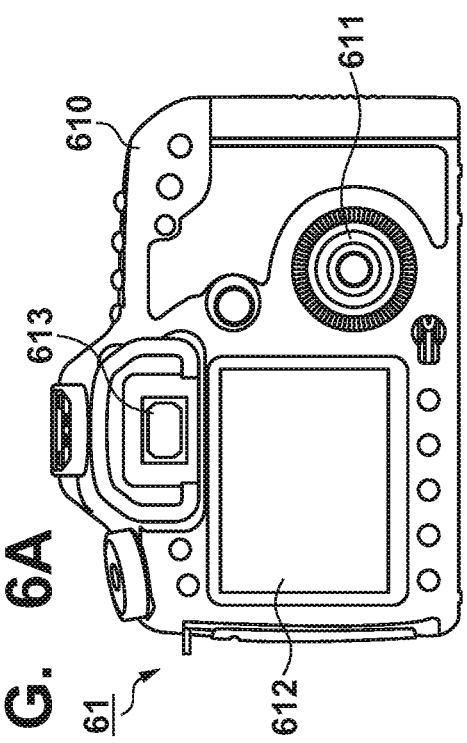

FIG. 6B is a schematic view of a portable device 62. The portable device 62 includes a display unit 621 and an operation unit 622, which are attached to a housing 620. The display apparatus 1 is applicable to the display unit 621. The user can cause the display unit 621 to display a desired image using the operation unit 622. The display unit 621 also has a function as another operation unit. That is, the display unit 621 can also function as a touch panel. Note that examples of the portable device 62 are a portable electronic device and a mobile device. For example, a game device and the like are included in addition to a portable telephone such as a smartphone.

Figure 6C:
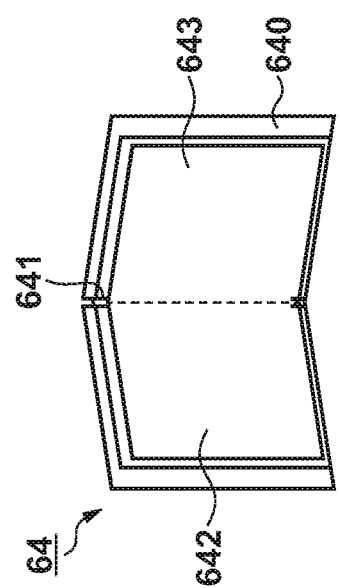

FIG. 6C is a schematic view of a monitor apparatus 63. The monitor apparatus 63 includes a frame 630, a support table 631 that supports the frame 630, and a display unit 632 surrounded by the frame 630. The display apparatus 1 is applicable to the display unit 632. The user can cause the display unit 632 to display a desired image using a remote controller (not shown) or an operation unit (not shown) provided on the frame 630 or the support table 631. Note that the monitor apparatus 63 only needs to be an apparatus capable of displaying a desired video. The concept of the monitor apparatus 63 includes a TV monitor (broadcasting receiver) and a monitor for a personal computer.

Figure 6D:
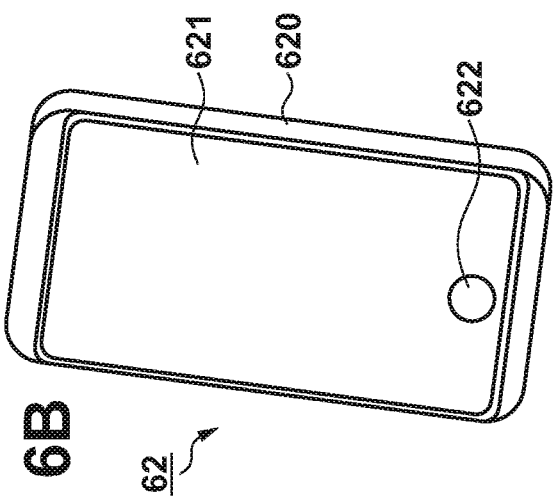

FIG. 6D is a schematic view of a foldable device 64. The device 64 includes a housing 640, a bending portion 641 that makes the housing 640 foldable, a first display unit 642, and a second display unit 643. The first display unit 642 and the second display unit 643 are attached to the housing 640 on both sides of the bending portion 641. For example, the first display unit 642 and the second display unit 643 are in a pause state when the housing 640 is folded and closed, and in a driving state when the housing 640 is opened. The display apparatus 1 is applicable to each of the first display unit 642 and the second display unit 643. The first display unit 642 and the second display unit 643 can display images different from each other or display one image in cooperation. One or both of the first display unit 642 and the second display unit 643 have a function as an operation unit. That is, each display unit can also function as a touch panel. Note that the concept of the device 64 includes not only a display (so-called foldable display) but also a tablet terminal such as a smartphone (so-called foldable phone).

Figure 7:
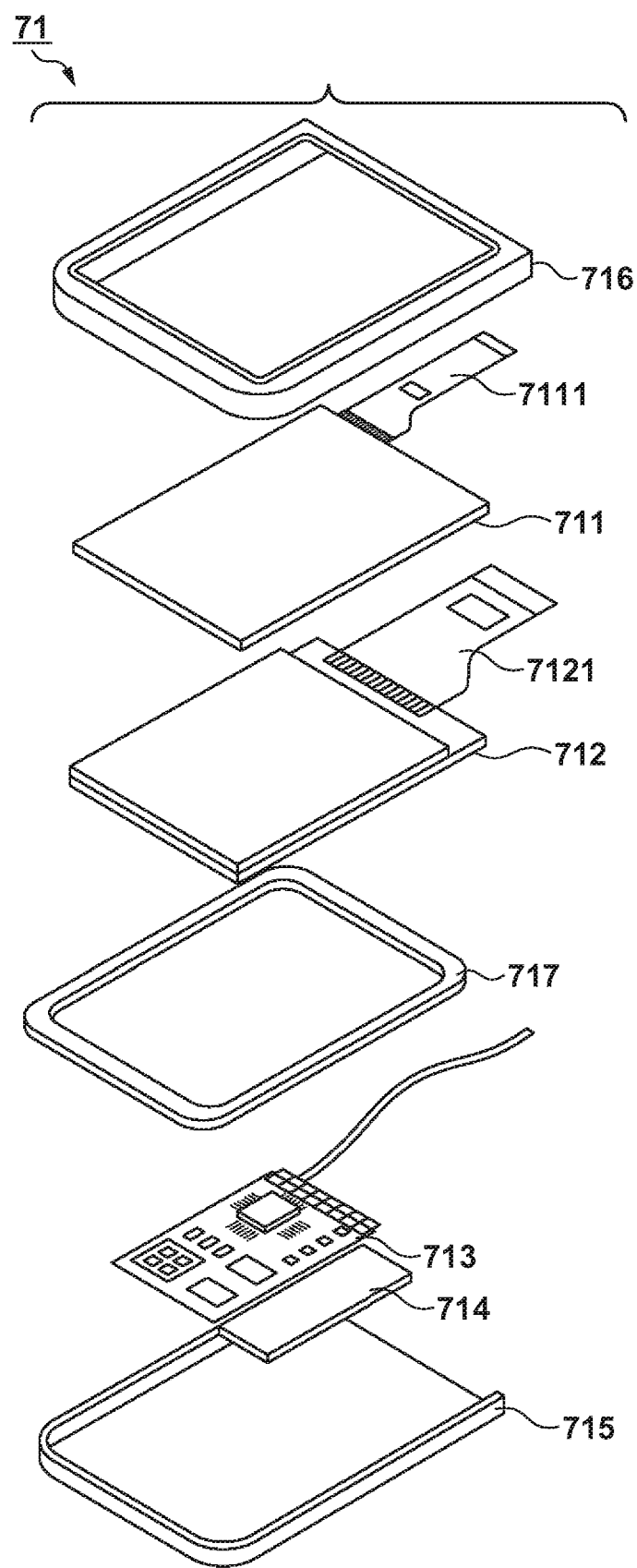
FIG. 7 is a view for explaining an application example of the display apparatus.

FIG. 7 shows an example of an exploded view of an electronic device 71 to which the display apparatus 1 is applied. The electronic device 71 includes a touch panel unit 711, a display panel unit 712, a mount substrate 713, a battery 714, and cover units 715 and 716 configured to store these units. The touch panel unit 711 is electrically connected to the mount substrate 713 via a flexible printed circuit board (FPC) 7111. The user can input operation contents via the touch panel unit 711. The display panel unit 712 is electrically connected to the mount substrate 713 via an FPC 7121. The display apparatus 1 is applicable to the display panel unit 712, and an image according to the operation contents by the user is displayed on the display panel unit 712.

The mount substrate 713 is formed by mounting a plurality of electronic components (for example, semiconductor packages of a power supply IC, a processor, and the like) on a rigid substrate. For example, the power supply IC receives a power from the battery 714 and generates a power used to drive the touch panel unit 711 and the display panel unit 712. The power is supplied to the touch panel unit 711 and the display panel unit 712 via the FPCs 7111 and 7121, respectively. Additionally, for example, the processor receives, via the FPC 7111, a signal representing operation contents input to the touch panel unit 711, and outputs a signal configured to display an image according to the operation contents to the display panel unit 712 via the FPC 7121.

The electric apparatus to which the display apparatus 1 is applicable is not limited to the above-described electric devices mainly aiming at displaying an image. The display apparatus 1 is used for various application purposes, and has high versatility. For example, the display apparatus 1 is applicable to an indoor illumination apparatus and is also applicable to a vehicle such as a two-wheeled vehicle or a four-wheeled vehicle. That is, the concept of the electric apparatus includes a variety of apparatuses that can operate based on electric energy.

Figure 8:
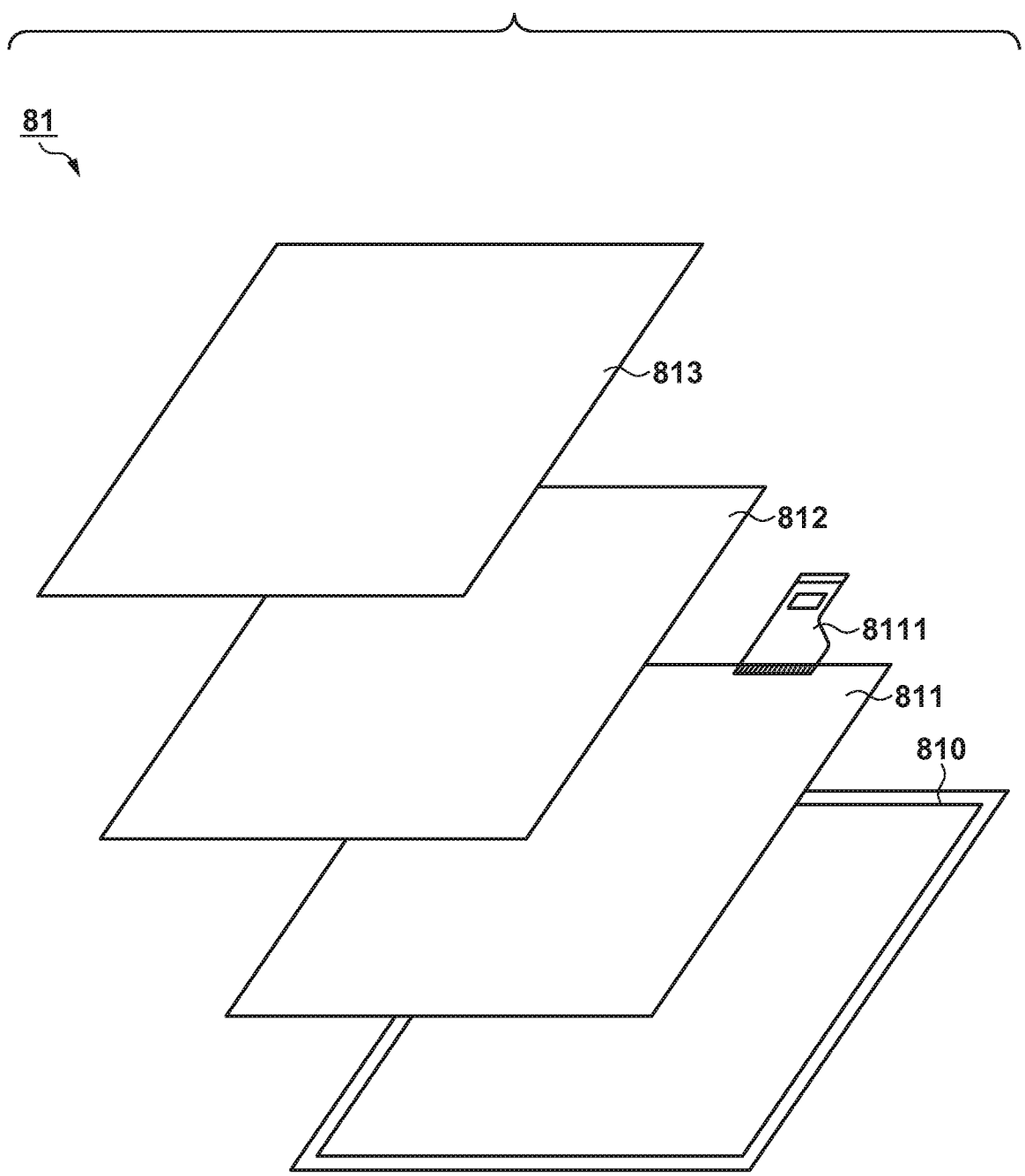
FIG. 8 is a view for explaining another application example of the display apparatus.

FIG. 8 shows an example of an exploded view of an illumination apparatus 81 to which the display apparatus 1 is applied. The illumination apparatus 81 includes a housing 810, a light source unit 811, an optical film 812, and a light diffusion unit 813. The light source unit 811 generates light when a switch (not shown) is turned on. The light of the light source unit 811 passes through the optical film 812 and is then diffused in various directions by the light diffusion unit 813. This makes it possible to appropriately illuminate the interior of a room. The display apparatus 1 is applicable to the light source unit 811, and the light source unit 811 can selectively generate light of a variety of colors to illuminate the interior of a room (in this example, the display apparatus 1 does not aim at displaying an image). For example, the light source unit 811 can selectively generate light of daylight color, daytime white color, white color, warm white color, incandescent bulb color, or the like based on the operation contents input by the user.

Figure 9:
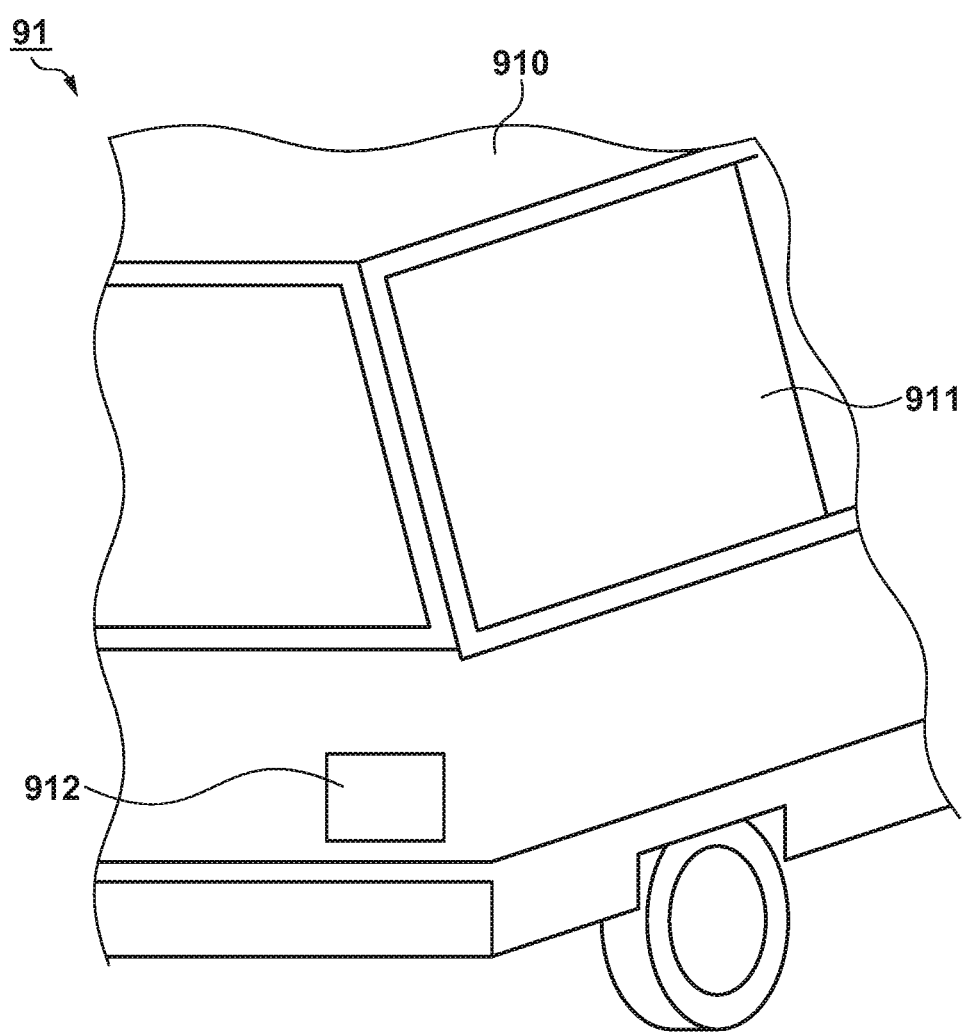
FIG. 9 is a view for explaining still another application example of the display apparatus.

FIG. 9 is a schematic view of the rear portion of a vehicle 91 to which the display apparatus 1 is applied. The vehicle 91 includes a windshield 911 and a light body 912, which are attached to a vehicle body 910. The driver of the vehicle 91 can view the situation outside the vehicle via the windshield 911. The display apparatus 1 is applicable to the windshield 911, and information (for example, the presence/absence of a walker) necessary for driving can be displayed on the windshield 911. In addition, the light body 912 generates light based on a driving operation of the driver. The display apparatus 1 is applicable to the light body 912 as well, and the light body 912 can selectively generate light according to the driving operation of the driver (in this example, the display apparatus 1 does not aim at displaying an image).

For example, the light body 912 can be used as a tail light indicating that the vehicle 91 is in a braking state, and can also be used as a direction indicator (blinker) indicating that the vehicle 91 is going to turn left or right.

Other Embodiments

Individual terms described in this specification are merely used for the purpose of explaining the present invention, and the present invention is not limited to the strict meanings of the terms and can also incorporate their equivalents.

According to the present invention, it is possible to implement both reduction of a leakage current between subpixels adjacent to each other and improvement of the light emission efficiency of individual subpixels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-112217, filed on Jun. 12, 2018, which is hereby incorporated by reference herein in its entirety.

What is claimed is:

1. A display apparatus comprising a plurality of pixels arranged on a substrate, in which at least one of the plurality of pixels includes a first subpixel, a second subpixel, and a third subpixel which are arranged to be adjacent to each other and are configured to generate light components of colors different from each other, and the first subpixel, the second subpixel, and the third subpixel comprise an organic compound layer including a light emission layer, wherein in the pixel, letting I1, I2, and I3 be driving current amounts of the first subpixel, the second subpixel, and the third subpixel of the pixel when generating white light of a predetermined luminance, if I1>I2>I3 holds, a current leakage between the first subpixel and the third subpixel is limited as compared to a current leakage between the second subpixel and the third subpixel, wherein a trench portion is provided in an upper surface of the substrate only between the lower electrode of the first subpixel and the lower electrode of the third subpixel, and wherein the organic compound layer is formed by stacking a plurality of layers and at least a part on a lower layer side of the plurality of layers is thinned or divided between the lower electrode of the first subpixel and the lower electrode of the third subpixel.

2. The apparatus according to claim 1, wherein a trench portion is not provided both (i) in the upper surface of the substrate between the lower electrode of the second subpixel and the lower electrode of the third subpixel, and (ii) in the upper surface of the substrate between the lower electrode of the first subpixel and the lower electrode of the second subpixel.

3. The apparatus according to claim 1, wherein each of the first subpixel, the second subpixel and the third subpixel includes a lower electrode arranged between the substrate and the light emission layer, wherein the light emission layer is arranged continuously between the first subpixel and the second subpixel, between the second subpixel and the third subpixel, and between the third subpixel and the first subpixel, so as to cover the lower electrodes of the first, second and third subpixels, further comprising a color filter layer above the lower electrodes of the first subpixel, the second subpixel, and the third subpixel, wherein a distance from the color filter layer to a bottom of the trench portion is longer than a distance from the color filter layer to a bottom face of the lower electrode.

4. The apparatus according to claim 1, wherein the first subpixel is configured to generate blue light, the second subpixel is configured to generate green light, and the third subpixel is configured to generate red light.

5. The apparatus according to claim 1, wherein a current leakage between the first subpixel and the third subpixel is limited as compared to a current leakage between the first subpixel and the second subpixel.

6. The apparatus according to claim 1, wherein the predetermined luminance is 1 $cd/m^2$ to 5 $cd/m^2$.

7. The apparatus according to claim 1, wherein a current leakage between the first subpixel and the second subpixel is limited as compared to the current leakage between the second subpixel and the third subpixel.

8. The apparatus according to claim 7, wherein the organic compound layer is formed by stacking a plurality of layers, and at least a part on a lower layer side of the plurality of layers is formed such that an electrical resistance between the lower electrode of the first subpixel and the lower electrode of the third subpixel becomes larger than an electrical resistance between the lower electrode of the second subpixel and the lower electrode of the third subpixel.

9. The apparatus according to claim 1, wherein the at least part on the lower layer side includes at least one of a hole injection layer, a hole transport layer, and an electron blocking layer.

10. The apparatus according to claim 1, wherein the at least part on the lower layer side includes at least one of an electron injection layer, an electron transport layer, and a hole blocking layer.

11. The apparatus according to claim 1, further comprising an upper electrode extended, above the lower electrodes of the first subpixel, the second subpixel, and the third subpixel, along an upper surface of the substrate to cover the organic compound layer.

12. A display apparatus comprising a plurality of pixels arranged on a substrate, in which at least one of the plurality of pixels includes a first subpixel, a second subpixel, and a third subpixel which are arranged to be adjacent to each other and are configured to generate light components of colors different from each other, and the first subpixel, the second subpixel, and the third subpixel comprise an organic compound layer including a light emission layer, wherein the first subpixel, the second subpixel and the third subpixel are configured to generate blue light, green light and red light, respectively, wherein a trench portion is provided in an upper surface of the substrate only between the lower electrode of the first subpixel and the lower electrode of the third subpixel, and wherein the organic compound layer is formed by stacking a plurality of layers and at least a part on a lower layer side of the plurality of layers is thinned or divided between the lower electrode of the first subpixel and the lower electrode of the third subpixel.

13. The apparatus according to claim 12, wherein each of the first subpixel, the second subpixel and the third subpixel includes a lower electrode arranged between the substrate and the light emission layer,
   wherein the light emission layer is arranged continuously between the first subpixel and the second subpixel, between the second subpixel and the third subpixel, and between the third subpixel and the first subpixel, so as to cover the lower electrodes of the first, second and third subpixels,
   further comprising a color filter layer above the lower electrodes of the first subpixel, the second subpixel, and the third subpixel,
   wherein a distance from the color filter layer to a bottom of the trench portion is longer than a distance from the color filter layer to a bottom face of the lower electrode.

14. The apparatus according to claim 13, further comprising an upper electrode extended, above the lower electrodes of the first subpixel, the second subpixel, and the third subpixel, along an upper surface of the substrate to cover the organic compound layer.

15. The display apparatus according to claim 12, wherein at least one of (i) a distance between the lower electrode of the second subpixel and the lower electrode of the third subpixel and (ii) a distance between the lower electrode of the first subpixel and the lower electrode of the second subpixel is shorter than a distance between the lower electrode of the first subpixel and the lower electrode of the third subpixel.

16. A display apparatus comprising a plurality of pixels arranged on a substrate, in which at least one of the plurality of pixels includes a first subpixel, a second subpixel, and a third subpixel which are arranged to be adjacent to each other and are configured to generate light components of colors different from each other, and the first subpixel, the second subpixel, and the third subpixel comprise an organic compound layer including a light emission layer,
   wherein the first subpixel, the second subpixel and the third subpixel are configured to generate blue light, green light and red light, respectively,
   wherein a trench portion is provided in an upper surface of the substrate only between the lower electrode of the first subpixel and the lower electrode of the third subpixel,
   wherein each of the first subpixel, the second subpixel and the third subpixel includes a lower electrode arranged between the substrate and the light emission layer,
   wherein the light emission layer is arranged continuously between the first subpixel and the second subpixel, between the second subpixel and the third subpixel, and between the third subpixel and the first subpixel, so as to cover the lower electrodes of the first, second and third sub pixels,
   further comprising a color filter layer above the lower electrodes of the first subpixel, the second subpixel, and the third subpixel, and
   wherein a distance from the color filter layer to a bottom of the trench portion is longer than a distance from the color filter layer to a bottom face of the lower electrode.

* * * * *